United States Patent
Lu et al.

(10) Patent No.: US 11,855,137 B2
(45) Date of Patent: Dec. 26, 2023

(54) SOI DEVICE STRUCTURE FOR ROBUST ISOLATION

(71) Applicant: Taiwan Semiconductor Manufacturing Company, Ltd., Hsinchu (TW)

(72) Inventors: Lin-Chen Lu, Kaohsiung (TW); Gulbagh Singh, Tainan (TW); Tsung-Han Tsai, Miaoli County (TW); Po-Jen Wang, Taichung (TW)

(73) Assignee: TAIWAN SEMICONDUCTOR MANUFACTURING COMPANY, LTD.

(*) Notice: Subject to any disclaimer, the term of this patent is extended or adjusted under 35 U.S.C. 154(b) by 0 days.

(21) Appl. No.: 17/592,997

(22) Filed: Feb. 4, 2022

(65) Prior Publication Data
US 2022/0157935 A1    May 19, 2022

Related U.S. Application Data

(63) Continuation of application No. 16/886,386, filed on May 28, 2020, now Pat. No. 11,257,902.

(51) Int. Cl.
*H01L 29/06* (2006.01)
*H01L 21/762* (2006.01)
*H01L 23/66* (2006.01)
*H01L 29/10* (2006.01)

(52) U.S. Cl.
CPC .... *H01L 29/0649* (2013.01); *H01L 21/76254* (2013.01); *H01L 23/66* (2013.01); *H01L 29/1095* (2013.01)

(58) Field of Classification Search
CPC ........... H01L 29/0649; H01L 29/76254; H01L 21/76254; H01L 21/0245; H01L 23/66; H01L 21/02381; H01L 29/1095
USPC .......................... 438/149, 479, 517; 257/347
See application file for complete search history.

(56) References Cited

U.S. PATENT DOCUMENTS

| | | | |
|---|---|---|---|
| 2009/0311477 A1* | 12/2009 | Aspar et al. | ........ H01L 21/2007 428/141 |
| 2012/0248622 A1* | 10/2012 | Sadaka | ............. H01L 21/76254 257/774 |
| 2018/0337146 A1* | 11/2018 | Englekirk et al. | ...... H01L 23/60 |
| 2020/0091429 A1 | 3/2020 | Slovin et al. | |

\* cited by examiner

*Primary Examiner* — Thinh T Nguyen
(74) *Attorney, Agent, or Firm* — FOLEY & LARDNER LLP

(57) ABSTRACT

This disclosure provides for robust isolation across the SOI structure. In contrast to forming a charge trap layer in specific areas on the structure, a charge trap layer may be built across the insulating/substrate interface. The charge trap layer may be an implantation layer formed throughout and below the insulation layer. Devices built on this SOI structure have reduced cross-talk between the devices. Due to the uniform structure, isolation is robust across the structure and not confined to certain areas. Additionally, deep trench implantation is not required to form the structure, eliminating cost. The semiconductor-on-insulator substrate may include an active silicon layer over an oxide layer. The oxide layer may be over a charge trap layer. The charge trap layer may be over a silicon substrate.

9 Claims, 18 Drawing Sheets

SOI DEVICE STRUCTURE FOR ROBUST ISOLATION

CROSS-REFERENCE TO RELATED APPLICATION

This application is related to and claims priority under 35 U.S. § 120 as a divisional application of U.S. Utility application Ser. No. 16/886,386, filed May 28, 2020, titled "NOVEL SOI DEVICE STRUCTURE FOR ROBUST ISOLATION," the entire contents of which are incorporated herein by reference for all purposes.

BACKGROUND

The present disclosure generally relates to semiconductor devices, and particularly to semiconductor-on-insulator devices and methods for their fabrication.

Semiconductor devices are used in a variety of electronic applications, such as personal computers, cell phones, digital cameras, and other electronic equipment, as examples. As technology has progressed, the demand for smaller semiconductor devices with improved performance has increased. As feature densities increase, the size of the transistor and space between transistors also need to scale smaller.

Integrated circuits have traditionally been formed on bulk semiconductor substrates. In recent years, semiconductor-on-insulator (SOI) substrates have emerged as an alternative to bulk semiconductor substrates. Semiconductor-on-insulator substrates may have advantages over bulk semiconductor substrates in decreasing cross-talk. An SOI substrate comprises a substrate, and an insulating layer overlaying the substrate. A device layer may be built overlaying the insulating layer.

To accommodate recent developments in the front-end-of-line, there is a need for improved semiconductor-on-insulator (SOI) substrates and devices, and a method of forming thereof.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
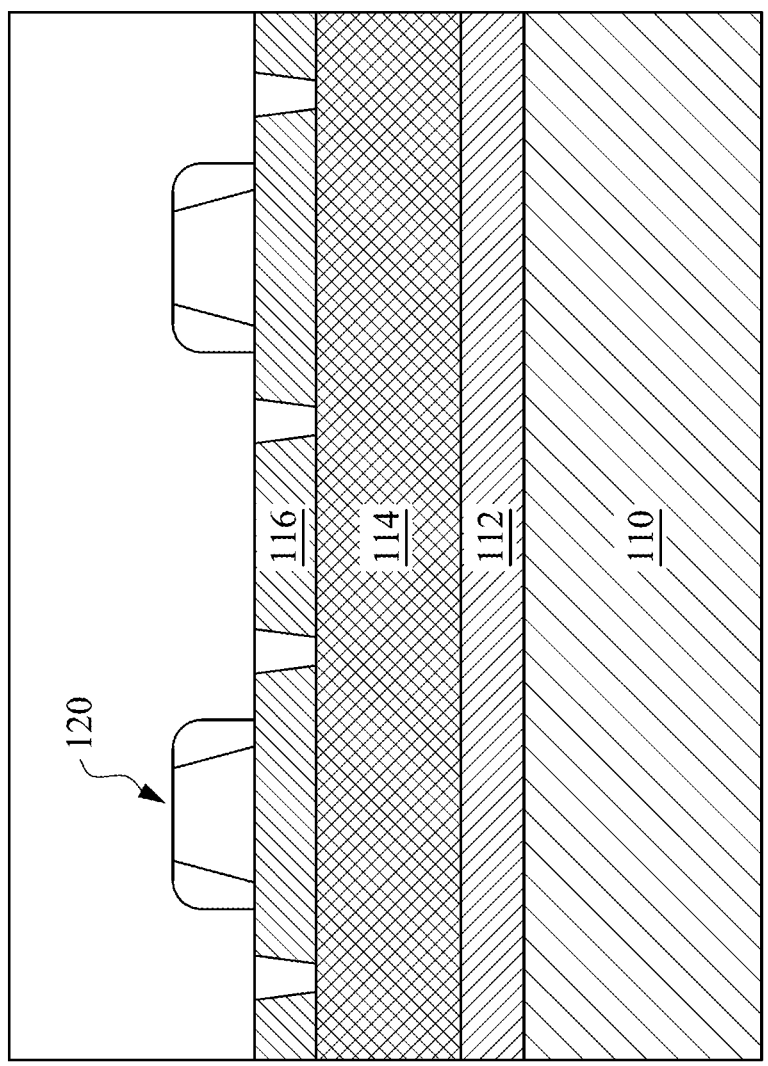
FIGS. 1 and 2 illustrate a cross-sectional view of a section of an example semiconductor device in accordance with some embodiments.

Silicon on insulator (SOI) devices have significantly lower device cross-talk than that of bulk silicon. Performance can be degraded, however, when a high conducting charge layer is generated at the insulating and substrate interface of the SOI structure. This may be due to the degradation of the SOI isolation performance.

To prevent the formation of this charge layer, a charge trap layer 112 or semiconductor isolation layer 112 may be formed at the interface of the insulating layer 114 and the substrate. This may be formed at specific areas on the substrate, however, there are drawbacks to this approach. This requires implantation through a deep trench which both increases cost and leads to robust isolation limited to specific areas on the substrate. Thus, there is a need for an SOI structure that is both low cost and has robust isolation across the SOI structure.

This disclosure provides for robust isolation across the SOI structure. In contrast to forming a charge trap layer in specific areas on the structure, a charge trap layer may be built across the insulating/substrate interface (sometimes an oxide/silicon interface.) The charge trap layer may be an implantation layer formed throughout and below the insulation layer. Devices built on this SOI structure may have reduced cross-talk between the devices. Due to the uniform structure, isolation is robust across the structure and not confined to certain areas. Additionally, deep trench implantation is not required to form the structure, eliminating cost.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The term "vertical," as used herein, means nominally perpendicular to the surface of a substrate.

The present disclosure provides various embodiments of providing a silicon on insulator structures. This silicon on insulator structures may provide for robust isolation of devices formed on its surface. The present disclosure also provides methods of manufacturing silicon on insulator structures. The present disclosure also discloses semiconductor devices including silicon on insulator structures and methods of forming the same. The semiconductor device may be included in a microprocessor, memory cell, and/or other integrated circuit (IC). It is noted that the method of FIG. 3 does not produce a completed semiconductor device. A completed semiconductor device may be fabricated using complementary metal-oxide-semiconductor (CMOS) technology processing. Accordingly, it is understood that additional processes may be provided before, during, and after the methods 302 through 322 of FIG. 3, and that some other processes may only be briefly described herein. Also, FIGS. 1-2, 4-14, and 16-18 are simplified for a better understanding of the present disclosure. For example, although the figures illustrate the semiconductor device, it is understood the IC may comprise a number of other devices comprising transistors, resistors, capacitors, inductors, fuses, etc.

Figure 2:
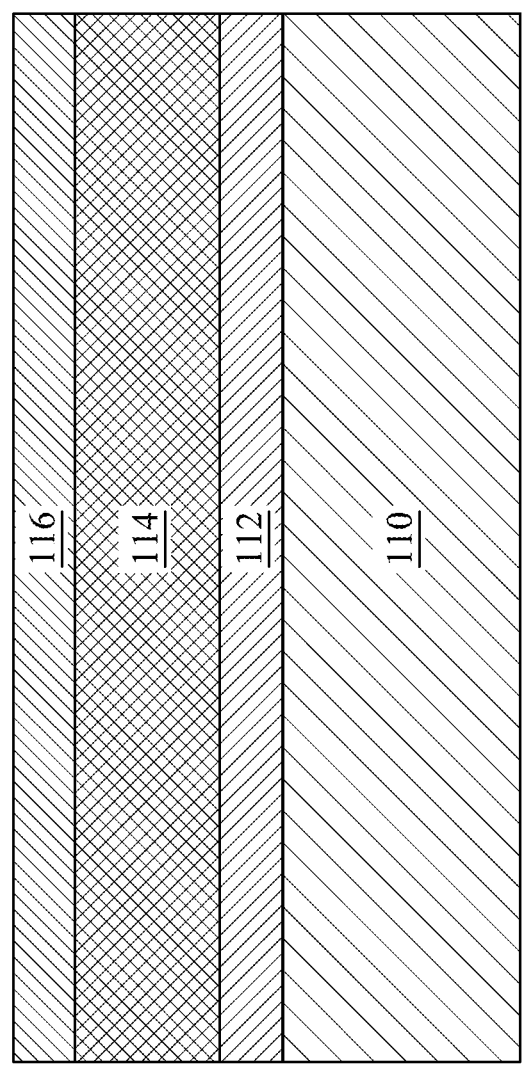
Figure 3:
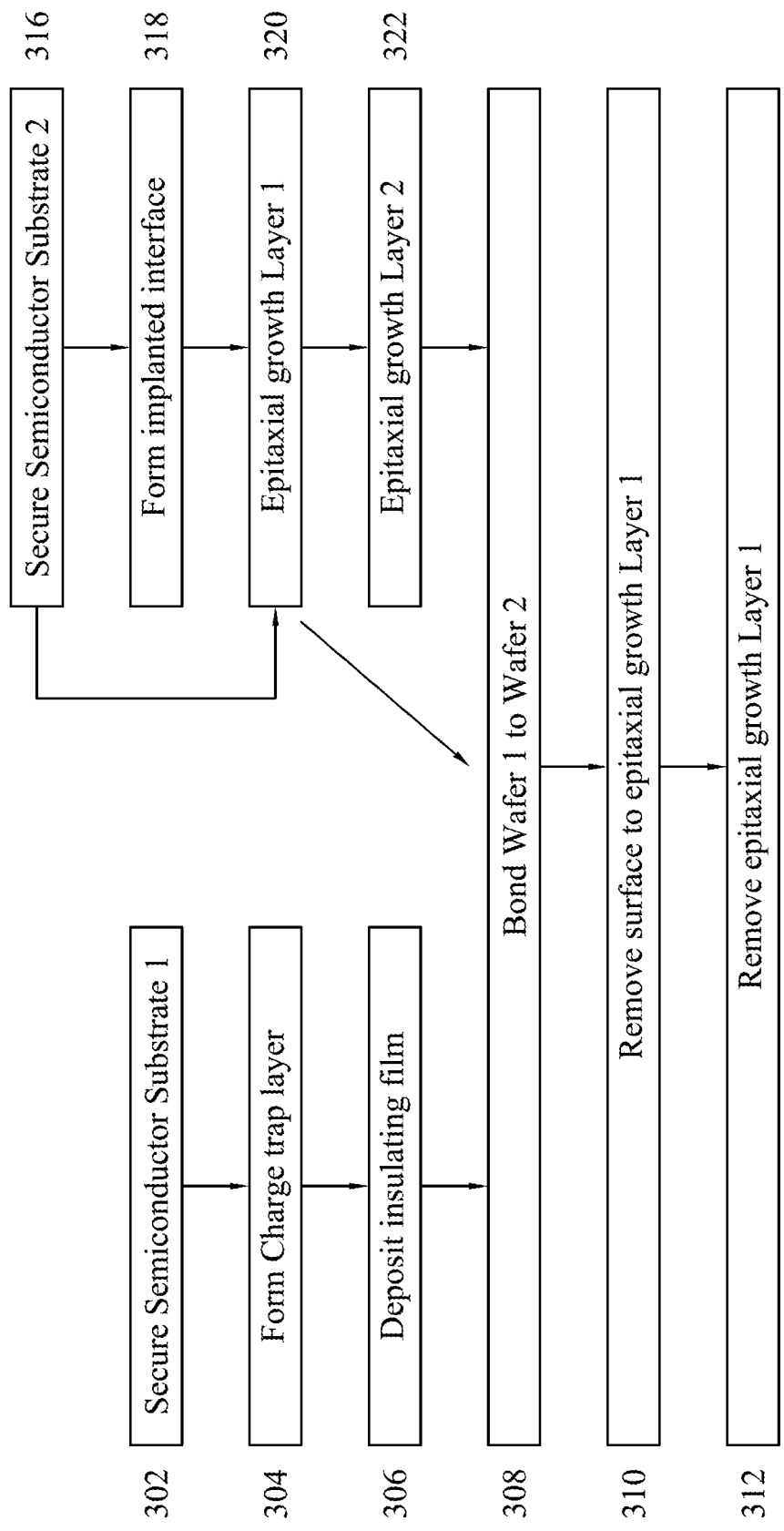
FIG. 3 illustrates a method of generating a novel substrate-on-insulator device in accordance with some embodiments.
Figure 4:
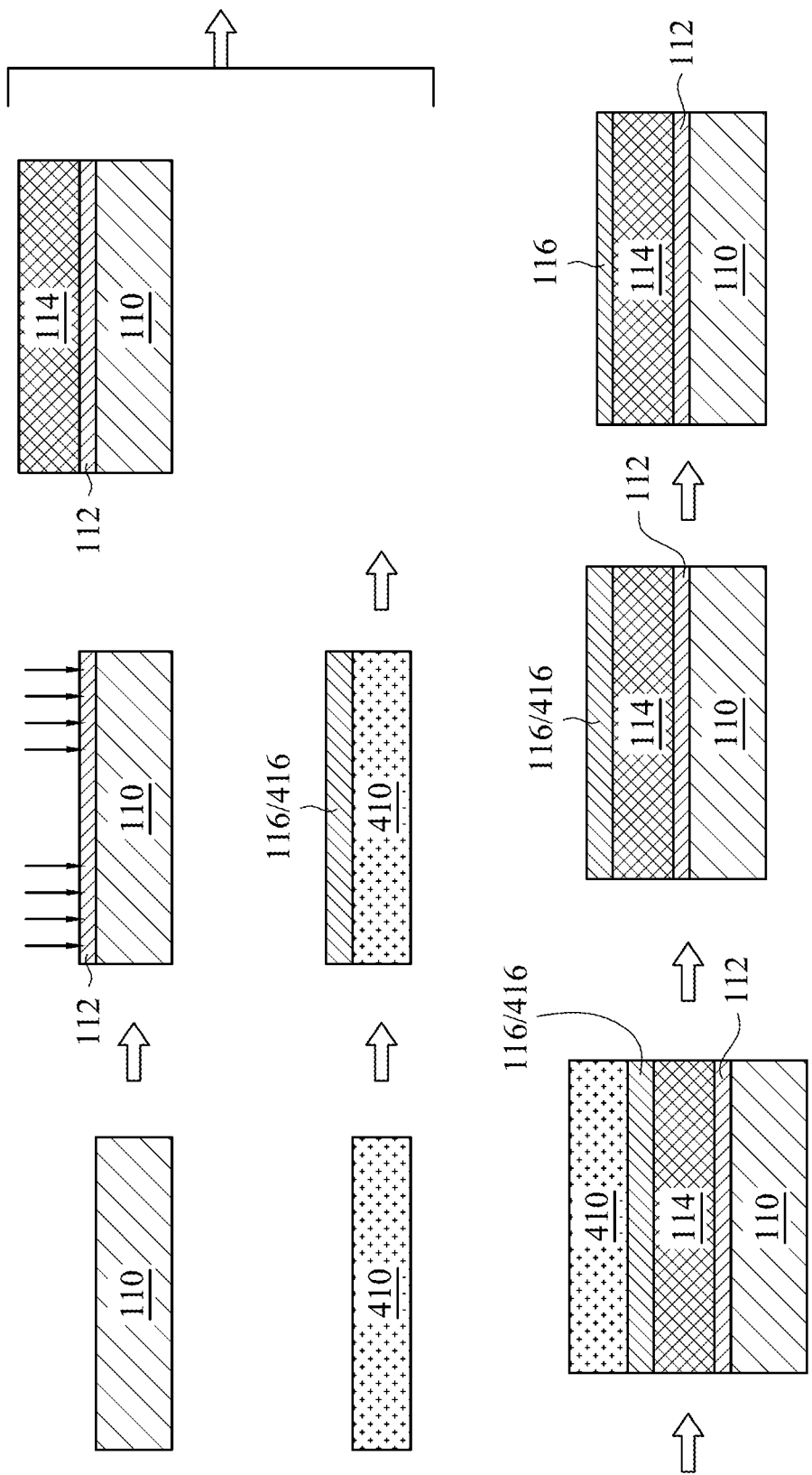
FIGS. 4, 5, 6, 7, 8, 9, 10, 11, 12 and 13 illustrate cross-sectional views of an example semiconductor device during various fabrication stages, made by the method of FIG. 3, in accordance with some embodiments.
Figure 14:
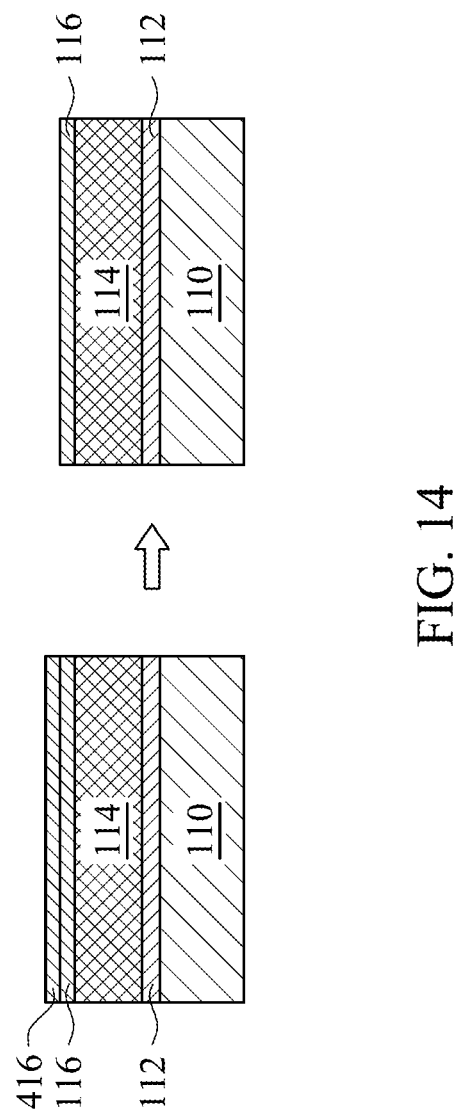
FIG. 14 illustrates a method of generating a novel substrate-on-insulator device in accordance with some embodiments.
Figure 15:
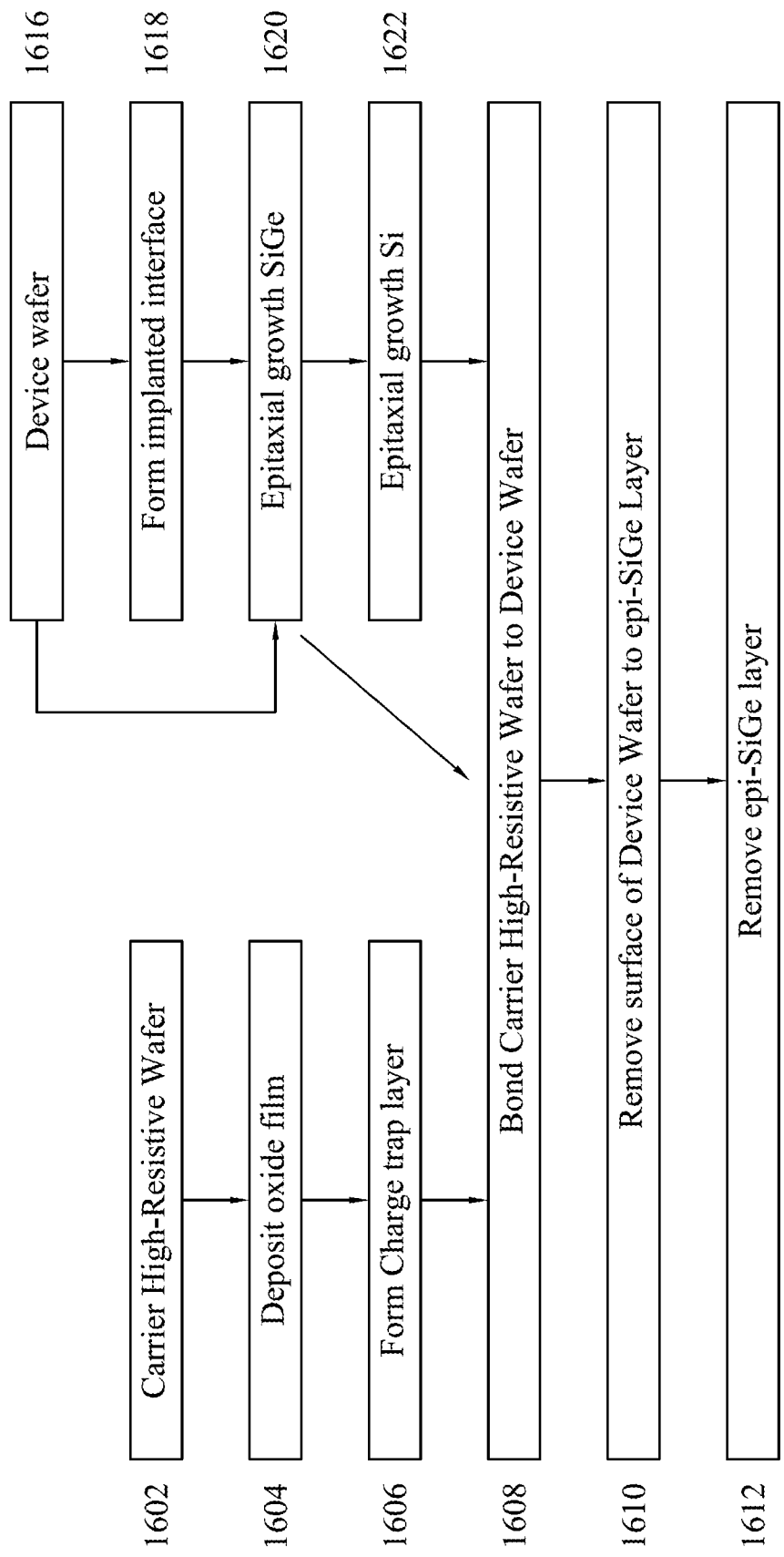
FIGS. 15 and 16 illustrate cross-sectional views of an example semiconductor device during various fabrication stages, made by the method of FIG. 14, in accordance with some embodiments.
Figure 16:
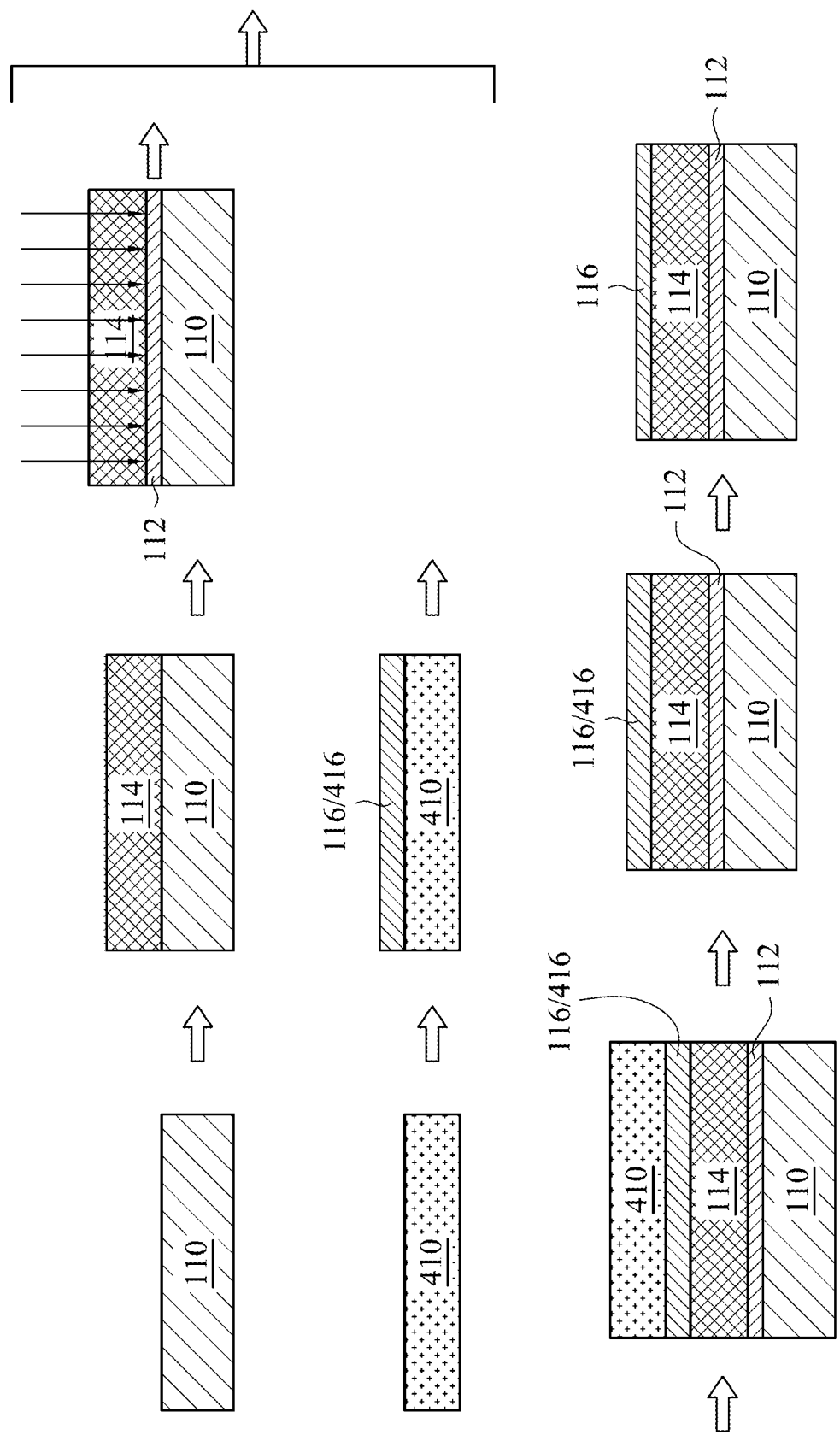
Figure 17:
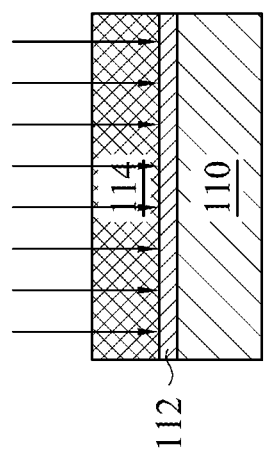
FIG. 17 illustrate cross-sectional views of an example semiconductor device during various fabrication stages, made by the method of FIG. 3 or 14, in accordance with some embodiments.
Figure 18:
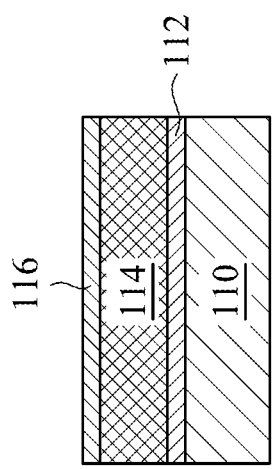
FIG. 18 illustrates an example of a multilayer semiconductor device made by the method of FIG. 3 or 14, in accordance with some embodiments.

FIGS. 1 and 2 illustrate a cross-sectional view of a section of an example semiconductor structure in accordance with some embodiments. FIG. 3 is a flowchart illustrating a method for fabricating a semiconductor device, according to various aspects of the present disclosure. FIGS. 4, 5, 6, 7, 8, 9, 10, 11, 12 and 13 show schematic cross-sectional views of the semiconductor device at various stages of fabrication according to an embodiment of the method of FIG. 3. FIG. 14 illustrates a method of generating a novel substrate-on-insulator device in accordance with some embodiments. FIGS. 15 and 16 illustrate cross-sectional views of an example semiconductor device during various fabrication stages, made by the method of FIG. 15, in accordance with some embodiments. FIGS. 16-17 illustrate cross-sectional views of an example semiconductor device during various fabrication stages, made by the method of FIG. 15, in accordance with some embodiments. FIG. 18 illustrates an example of a silicon-on-insulator substrate made by the method of FIG. 3 or 15, in accordance with some embodiments.

FIG. 1 shows one embodiment of one type of device that may be formed in accordance with some embodiments. In one embodiment, a metal-oxide-semiconductor field-effect transistor, or MOSFET structure 120 may be formed over an active silicon layer 116. The active silicon layer 116 may be directly over an oxide layer 114, which may be referred to as a buried oxide layer 114 or BOX. The BOX 114 may be directly over a charge trap layer 112. The charge trap layer 112 may be formed over a substrate 110.

FIG. 2 shows an example structure that may be formed in accordance with some embodiments. The structure may include an active silicon layer 116. The active silicon layer 116 may be directly over an insulating layer 114, such as an oxide layer 114, which may be referred to as a buried oxide layer 114 or BOX. The insulating layer 114 may be directly over a charge trap layer 112. The charge trap layer 112 may be formed over a substrate 110. The entire structure of FIG. 2 may be used as a silicon-on-insulator (SOI) substrate to form many types of devices. This SOI may be used in the place of bulk silicon to manufacture any device for which bulk silicon may be used.

FIG. 3 illustrates one embodiment of a method to generate the silicon-on-insulator substrate. The method 300 may proceed to step 302 where a substrate 110 is secured. Next, at step 304, a charge trap layer 112 may be formed. Next, at step 306, an oxide layer 114 may be deposited.

In parallel with steps 302-306, the following steps 316-322 may be performed. First, at step 316, a wafer may be secured. Next, at step 318, an implanted surface may be formed. Next, at step 320 a surface may be formed by epitaxy 116/416. Next, at step 322 a second surface may be formed by epitaxy.

At step 308, the wafer from step 306 may be bonded to the wafer at step 322. Next, at step 310, the surface of the bonded wafer may be removed to reveal the first epitaxy layer 116/416. At step 312. The surface may be further removed to expose the second epitaxy layer 116.

FIGS. 4-13 illustrate a cross-sectional view of one embodiment of the method illustrated in FIG. 3. In some embodiments, steps may be combined. For example, in some embodiments, a doped device semiconductor substrate 110/112 may be secured, combining steps 316 and 318 by securing the substrate 110/112 shown in FIG. 6.

Figure 5:

Referring to FIGS. 3 and 5, the method 300 proceeds to step 302 in which a semiconductor substrate 110 is secured. Semiconductor substrate 110 is a substrate as employed in a semiconductor integrated circuit fabrication, and integrated circuits may be formed therein and/or thereupon. The term "semiconductor substrate" as used herein refers to as any construction comprising semiconductor material, for example, a silicon substrate with or without an epitaxial layer.

In some embodiments, the semiconductor substrate 110 is a high resistivity silicon wafer. The high resistivity silicon wafer may be a monocrystalline silicon. In some embodiments, the high resistivity silicon wafer has a bulk resistivity larger than 40 Ohm-cm. In some embodiments, the high resistivity silicon wafer has a bulk resistivity larger than 1 kOhm-cm. In some embodiments, the high resistivity silicon wafer has a bulk resistivity larger than than 10 kOhm-cm. The high resistivity silicon wafer may have a bulk resistivity between 1 kOhm-cm and 10 kOhm-cm. These values are given as examples and other values and ranges of values are within the scope of the disclosure. The high resistivity silicon wafer may form the substrate for a silicon on insulator structure which may in part be due to the resistivity of the substrate. The surface of the wafer may be passivated, for example by thin-film deposition. A pre-cleaning process may be performed to clean the surface of the substrate. This process may be a wet clean process, such as an RCA clean, or a dry clean process such as thermal or plasma treatment.

Figure 6:
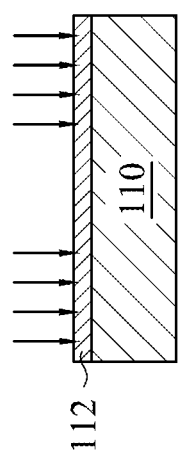

Referring to FIGS. 3 and 6, the method 300 proceeds to step 304 in which a charge trap layer 112 is formed. The charge trap layer 112 may be an amorphous or disordered silicon layer. The charge trap layer 112 may be an implanted Silicon layer. The charge trap layer 112 may contain a plurality of crystal defects, which may trap charge carriers. The charge trap layer 112 may be comprised of one layer or of multiple layers.

In some embodiments, the charge trap layer 112 may be formed by implant, such as by ion implantation. The ion implantation may be continuous over the substrate. According to an exemplary embodiment, the implant species may be an electrically neutral species. In some cases, the implant species may be a large atomic weight species. The implant species may be a noble gas. Non-limiting examples of implant species include Xe, Ar, Ge, Si, and combinations thereof. The thickness of the charge trap layer 112 or semiconductor isolation layer 112 may be, for instance, between about 5 nm and about 300 nm. The thickness may be sufficient to prevent charge build up in the structure and may be manufactured using the processes disclosed herein.

The implantation depth range may be between 5 nm and 300 nm. In some embodiments, the implantation process may be performed using a dose that is between $1e^{12}$ ions/cm$^2$ and $1e^{15}$ ions/cm$^2$. In some embodiments, the implantation process may be performed using a dose that is greater than or equal to $1e^{15}$ ions/cm$^2$. In some embodiments, the implantation process may be performed at energies that range between approximately 1 kV and approximately 1 MV. These values are given as examples and other values and ranges of values are within the scope of the disclosure.

Figure 7:
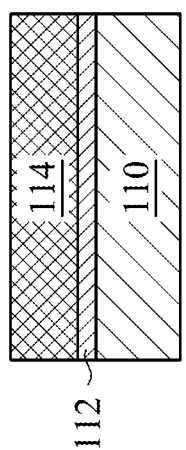

Referring to FIGS. 3 and 7, the method 300 proceeds to step 306 in which an insulating layer 114 is formed. The insulating layer 114 may be an oxide layer 114. In one example, the oxide layer 114 may be silicon dioxide. The insulating layer 114 may form a buried oxide, or BOX. The insulating layer 114 may be, in some embodiments, between 10 nm and 10,000 nm. The insulating layer 114 may be between 10 nm and 1,000 nm. In some embodiments, the insulating layer 114 may be between 10 nm and 800 nm. The insulating layer 114 may be between 10 nm and 600 nm. These values are given as examples and other values and ranges of values are within the scope of the disclosure.

The insulating layer 114 may be formed by deposition. Non-limiting methods of deposition include chemical vapor deposition (CVD), physical vapor deposition (PVD), atomic layer deposition (ALD), remote plasma enhanced chemical vapor deposition (RPECVD), liquid source misted chemical deposition (LSMCD), coating, spin-coating or another process that is adapted to form a thin film layer over the substrate. The insulating layer 114 may be formed by thermal growth. Thermal growth may include a gas soak in a gas such as $N_2$, $H_2$, $CO_2$, $O_2$, air, or mixtures thereof at ambient or elevated temperatures. Other methods of forming the insulating layer may include plasma treatment in a vacuum environment or in the presence of gasses such as $N_2$, $H_2$, $NH_3$ $CO_2$, $O_2$, air, or mixtures thereof at ambient or elevated temperatures In the case where the insulating layer 114 is an oxide, the oxide layer 114 may be formed by wet oxidation, for instance by thermal treatment using steam. The oxide layer 114 may be formed using dry oxidation, for instance by thermal or plasma treatment in air or $O_2$.

Figure 8:

Referring to FIGS. 3 and 8, the method 300 proceeds to the step 316 which may be performed in parallel with steps 302-306. At step 316, a semiconductor substrate 410 is secured. The substrate 410 may be a device wafer. The substrate 410 secured may be P−/P+ silicon, allowing method 300 to skip step 318.

Figure 9:
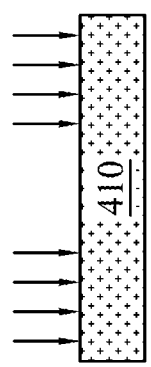

Referring to FIGS. 3 and 9, in some embodiments the method 300 may proceed to step 318 which may be performed in parallel with steps 302-306. At step 318, an implanted interface is formed on semiconductor substrate 410. The implanted interface may transform substrate 410 from device silicon to P−/P+ silicon. Implantation may occur by ion implantation, for instance by doping with a dopant atom such as boron, phosphorous, or arsenic. These are merely examples and those skilled in the art are well aware of the various methods for forming doped silicon.

Figure 10:
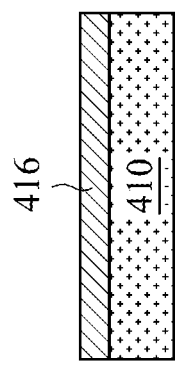

Referring to FIGS. 3 and 10, the method 300 proceeds to step 320 which may be performed in parallel with steps 302-306. At step 320, a layer 416 may be formed by epitaxial growth. The layer may be silicon germanium. The silicon germanium may be expressed as $Si_{1-x}Ge_x$ wherein x is the atomic percentage of germanium in the silicon germanium and may be greater than 0 and less than or equal to 1. According to other embodiments, the layer may be a material of a III-V compound semiconductor which may be, for example, GaA, InP, GaN, InGaAs, In AlAs, GaAs, GaSb, AlAs, AlP, GaP or many others. Epitaxial growth may occur by molecular beam epitaxy (MBE), liquid phase epitaxy (LPE), vapor phase epitaxy (VPE), selective epitaxial growth (SEG), metal-organic CVD (MOCVD) or similar processes.

Figure 11:
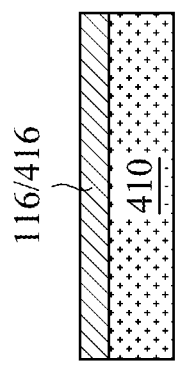

Referring to FIGS. 3 and 11, the method 300 proceeds to step 322 which may be performed in parallel with steps 302-306. At step 322, a second layer 116 may be formed by epitaxial growth. The second layer formed by epitaxial growth may be silicon. The epitaxial grown silicon may form the active silicon layer 116. Epitaxial growth may occur by molecular beam epitaxy (MBE), liquid phase epitaxy (LPE), vapor phase epitaxy (VPE), selective epitaxial growth (SEG), metal-organic CVD (MOCVD) or similar processes. In some embodiments, steps 320 and 322 may occur in one step.

Figure 12:
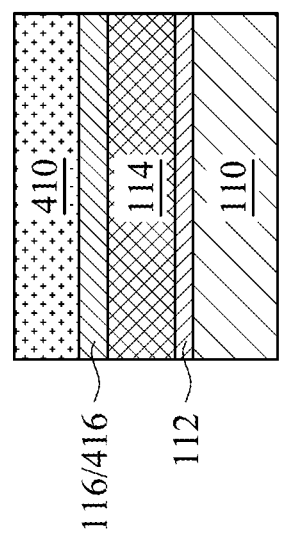

Referring to FIGS. 3 and 12, the method 300 proceeds to step 308 where the substrate 110 formed in steps 302-306 (FIGS. 5-7) (also referred to as the high resistive wafer) is bonded to the substrate 410 formed in steps 218-322 (FIGS. 8-9) (also referred to as the device wafer). Bonding may occur by contacting the face of the insulating (BOX) layer of the high resistivity wafer to the face of the epitaxial layer of the device wafer. In some embodiments, the high resistive wafer and device wafer may be bonded using direct bonding. In some embodiments, the high resistive wafer and device wafer may be bonded using thermal bonding. In some embodiments the high resistive wafer and device wafer are bonded at room temperature. In some embodiments, the high resistive wafer and device wafer are bonded by annealing at a temperature at or above room temperature and at or below 450° C. This values is given as examples and other values and ranges of values are within the scope of the disclosure. In some embodiments, the high resistive wafer and device wafer may be bonded at temperatures above room temperature. In some embodiments, the high resistive wafer and device wafer are bonded by annealing at a temperature at or below 300° C., 400° C., 700° C., or 800° C. These values are given as examples and other values and ranges of values are within the scope of the disclosure.

The substrates may optionally be preprocessed prior to bonding. Preprocessing may occur by dry processing techniques such as plasma treatment, thermal treatment, or UV/ozone treatment. Preprocessing treatment may occur by wet processing techniques such as standard clean 1. In some embodiments, preprocessing is plasma surface activation, for example by subjecting the surface to oxygen plasma or nitrogen plasma. Oxygen plasma surface oxidation may render the surface of the substrate hydrophilic.

Wafer bonding may occur by plasma activated bonding, surface activated bonding, or ultra high vacuum. Wafer bonding may occur by surface activation due to chemical mechanical polishing (CMP), chemical surface treatment, or implantation. Wafer bonding by annealing may be supplemented with one of the forgoing additional treatments. Supplemental treatment may lower the annealing temperature. Post preprocessing or other supplemental treatment, the high resistive wafer and device wafer may be bonded by annealing at a temperature at or below 300° C., 400° C., 700° C., or 800° C. These values are given as examples and other values and ranges of values are within the scope of the disclosure.

Figure 13:
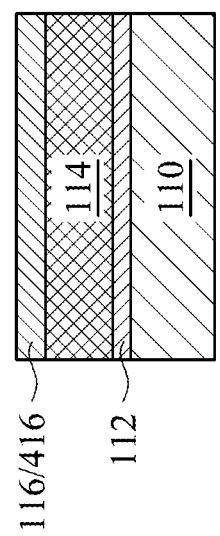

Referring to FIGS. 3 and 13, the method 300 proceeds to step 310 where the surface of the bonded wafer may be removed to the epi-SiGe layer. Removal may include thinning, for example by polishing. Polishing may be by Chemical Mechanical Polish. (CMP) Removal may be by wet etch, dry etch, or a combination of processes. These methods are given as examples and other methods known in the art are within the scope of the disclosure.

Referring to FIGS. 3 and 14, the method 300 proceeds to step 312 where the epi-SiGe layer is removed. Removal may be by polishing, wet etch, dry etch, or a combination of processes. Polishing may be Chemical Mechanical Polishing (CMP). The dry etch process may be plasma etching. The dry etch process may be reactive ion etching. The dry etch process may be sputter etching. The dry etching may be Vapor phase etching. The dry etching may be ion milling. This list is representative and those skilled in the art are aware of the many methods currently used and which may in the future be used in the dry etch process.

Removal may be by wet etch processes. The wet etch may be an acid etch or solution etch. The wet etch may occur at room, low, or elevated temperatures. The wet etch may be isotropic or anisotropic. Those skilled in the art are aware of the many chemicals currently used and which may in the future be used in the wet etch process.

FIGS. 15-16 illustrate an alternate embodiment of the present invention. FIGS. 15-16 present a second embodiment for the method leading to the production of a silicon-on-insulator substrate. The second embodiment differs from the first embodiment in that the oxide layer 114 is formed before the charge trap layer 112. The details of the method of FIG. 15 largely correspond to those outlined for the method in FIG. 3 and are omitted here except where they deviate from those of the method in FIG. 3.

FIG. 16 illustrates cross-sectional views of an example semiconductor device during various fabrication stages, made by the method of FIG. 15, in accordance with some embodiments. The method 1600 may proceed to step 1602 where a substrate is secured. Next, at step 1604, an oxide layer 114 may be deposited. Next, at step 1606, a charge trap layer 112 may be formed. In parallel with steps 1602-1606, the following steps 1616-1622 may be performed. First, at step 1616, a wafer may be secured. Next, at step 1618, an implanted surface may be formed. Next, at step 1620 a surface may be formed, for example, by epitaxy. Next, at step 1622 a second surface may optionally be formed, for example, by epitaxy. At step 1608, the wafer from step 1606 may be bonded to the wafer at step 1622. Next, at step 1610, the surface of the bonded wafer may be removed to reveal the first formed, for example, epitaxy layer 116/416. At optional step 1612 the surface may be further removed to expose the second formed, for example epitaxy, layer 116.

FIG. 17 illustrates a cross-sectional view of step 1606, made by the method of FIG. 15, in accordance with some embodiments. In this embodiment, the charge trap layer 112 is formed after the oxide layer 114 is deposited. The charge trap layer 112 may be formed by ion implant. This method is given as an examples and other methods of forming a charge trap layer 112 is within the scope of the disclosure. The charge trap layer 112 may be formed between the insulating layer 114 or buried oxide layer 114 and the silicon substrate.

FIG. 18 illustrates one embodiment of a silicon-on-insulator substrate formed using one of method 300 or method 1600. The entire structure of FIG. 18 may be used as a silicon-on-insulator (SOI) substrate to form many types of devices.

The structure may include an active layer 116. The active layer 116 may be the layer under the gate oxide of the the MOSFET is formed. Other devices may be formed on the active layer 116. The active layer 116 may contain silicon. The active layer may be doped, The active layer denotes the layer of a semiconductor material in or on which components will be subsequently manufactured.

The active silicon layer 116 may be directly over an insulating layer 114. The insulating layer 114 may extend along the entire length and width of the active silicon layer 116. The span of the insulating layer 114 may allow devices built on the active layer to be robustly isolated from one another. The insulating layer 114 may be an oxide layer 114, which may be referred to as a buried oxide layer 114 or BOX.

The BOX 114 may be directly over a charge trap layer 112. The insulating charge trap layer 114 may extend along the entire length and width of the active silicon layer 116 and insulating layer 114. The span of the charge trap layer 112 may allow devices built on the active layer to be robustly isolated from one another. The span of the charge trap layer 112 may also prevent charge build up. The charge trap layer 112 may be formed over a substrate 110. The charge trap layer 112 may be an amorphous, disordered, or implanted silicon layer.

The charge trap layer 112 may be over a substrate. The substrate may be a high resistivity silicon wafer. In some embodiments, the high resistivity silicon wafer is a monocrystalline silicon. The high resistivity silicon wafer may have a bulk resistivity larger than 40 Ohm-cm. The high resistivity silicon wafer may have a bulk resistivity larger than 1 kOhm-cm. The high resistivity silicon wafer may have a bulk resistivity as higher than 10 kOhm-cm. The high resistivity silicon wafer may have a bulk resistivity between 1 kOhm-cm and 10 kOhm-cm. These values are given as examples and other values and ranges of values are within the scope of the disclosure.

The foregoing methods, structures, devices, and embodiments exhibit numerous advantages. A specific area etch by deep trench etch and implantation is not required. Instead, the structure can include a charge trap layer 112 between the buried oxide layer 114 and silicon substrate throughout the substrate, spanning the length and width of the substrate. Additionally, the charge trap layer 112 can be created through implantation or bombardment. Forming the charge trap layer 112 between the buried oxide layer 114 and high resistive silicon substrate throughout the structure, for instance by implantation or bombardment throughout the structure, can achieve better isolation and lower leakage performance. Devices formed on this substrate may exhibit better isolation and lower leakage performance when compared with similar devices formed on a substrate which has implantation in a specific small area instead of throughout. Additionally, the foregoing process does not depend on a deep trench etch process such as those used to form a structure with specific area implantation. Avoiding the need for a deep trench etch process can result in lower manufacturing cost.

In some embodiments, the disclosed structure is a semiconductor-on-insulator substrate, comprising an active silicon layer 116 which may be over an oxide layer 114. The oxide layer 114 may be over a charge trap layer 112. The charge trap 112 layer may be over a silicon substrate 110. In some embodiments, the charge trap layer 112 may include one or more of amorphous silicon, disordered silicon layer, and implanted silicon. The silicon substrate 110 may have a resistivity between 1,000 ohm-cm and 10,000 ohm-cm.

In some embodiments, the charge trap layer 112 implanted species is one of Xe, Ar, GE, or Si. These species are given as examples and other species used to form a charge trap layer are within the scope of the disclosure. The thickness of the charge trap or semiconductor isolation layer 112 may be between 5 nm and 300 nm. The thickness may be sufficient to prevent charge build up in the structure and may be manufactured using the processes disclosed herein. These values are given as examples and other ranges of values are within the scope of the disclosure.

In some embodiments, the disclosed semiconductor-on-insulator substrate may further comprise a source, a gate, and a drain over the active silicon layer 116. The source, the gate, and the drain may be in direct contact with the active silicon layer 116.

In some embodiments, the method of forming a semiconductor-on-insulator substrate may include multiple steps. The steps may include forming a charge trap layer 112 on a first silicon substrate 110. The steps may include forming an oxide layer 114 over the charge trap layer 112. The steps may include forming an implanted interface over a second substrate 410. The steps may include depositing a first epitaxial layer 116 over the implanted interface of the second substrate 410. The steps may include bonding the first epitaxial layer 116 to the oxide layer 114. The steps may include removing the second substrate 410. The steps may include removing additional layers to reach the first epitaxial layer 116.

The method may further include forming a second epitaxial layer 416 between the first epitaxial layer 116 and the implanted interface of the second substrate 410. The second epitaxial layer 416 may be silicon germanium. Silicon germanium is given as an examples and other epitaxial layers are within the scope of the disclosure. The first epitaxial layer 116 may be active silicon.

The charge trap layer 112 may be formed by ion implantation. The ion implantation may be caused by bombardment with one or more of Xe, Ge, Ar, and Si. These species are given as examples and other species used to form the charge trap layer 112 are within the scope of the disclosure.

The first epitaxial layer 116 may be bonded to the oxide layer 114 through thermal annealing. The first epitaxial layer 116 may be treated with a plasma prior to thermal annealing. The oxide layer 114 may treated with a plasma prior to thermal annealing.

In some embodiments, the charge trap layer 112 is formed prior to formation of the oxide layer 114. In other embodiments, the charge trap layer 112 is formed after the formation of the oxide layer 114.

In some embodiments, the method of forming a semiconductor-on-insulator substrate may include the steps outlined below. The method may include forming a charge trap layer 112 on a silicon substrate 110. The method may include forming an oxide layer 114 over the charge trap layer 112. The method may include securing a doped second substrate 410. The method may include depositing a first epitaxial layer 116 over the doped substrate 410. The method may include bonding the first epitaxial layer 116 to the oxide layer 114. The method may include removing at least a portion of the doped substrate 410. The method may include removing additional layers to reach the first epitaxial layer 116.

In some embodiments, the doped substrate 410 may be P+ silicon. In some embodiments, the doped substrate 410 may be P− silicon.

The method may include removing at least a portion of the doped substrate 410 is achieved using Chemical Mechanical Polish (CMP).

In one aspect of the present disclosure, disclosed is a semiconductor device which may include a semiconductor substrate. The device may also include a semiconductor isolation layer fully overlaying the semiconductor substrate. The device may additionally include an oxide layer fully overlaying the semiconductor isolation layer. In some embodiments, the device may include one or more device features formed over the oxide layer.

In another aspect of the present disclosure, the structure disclosed may be a semiconductor device, including a semiconductor substrate. The structure may also include a semiconductor isolation layer that extends along the entire active region. The structure may further include a buried oxide layer fully overlaying the semiconductor isolation layer. In some embodiments, the structure may include one or more device features formed over the oxide layer in the active region.

In yet another aspect of the present disclosure, disclosed may be a method of forming a structure. The structure may be a substrate. The structure may be a semiconductor device. The method may include securing a substrate. The method may include forming a buried oxide layer. The method may include forming a semiconductor isolation layer between the buried oxide layer and substrate. In some embodiments, the method may include forming an active layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   providing a first substrate;
   forming a buried oxide layer over the first substrate;
   forming an active layer over the buried oxide layer; and
   forming a semiconductor isolation layer between the buried oxide layer and the first substrate through an ion implantation process, wherein the semiconductor isolation layer fully overlays the first substrate.

2. The method of claim 1, wherein the active layer is formed on a second substrate, the method further comprises:
   prior to forming the buried oxide layer, forming the semiconductor isolation layer;
   bonding the second substrate to the first substrate, with the active layer contacting the buried oxide layer; and
   removing the second substrate.

3. The method of claim 1, wherein the active layer is formed on a second substrate, the method further comprises:
   subsequently to forming the buried oxide layer, forming the semiconductor isolation layer between the first substrate and the buried oxide layer;

bonding the second substrate to the first substrate, with the active layer contacting the buried oxide layer; and removing the second substrate.

4. The method of claim 1, wherein the semiconductor isolation layer is formed by bombardment with at least one of: Xe, Ge, Ar, or Si.

5. The method of claim 1, wherein the ion implantation extends fully across the first substrate.

6. The method of claim 1, wherein the ion implantation extends fully across the buried oxide layer.

7. The method of claim 1, wherein the semiconductor isolation layer is formed before forming the buried oxide layer.

8. The method of claim 1, wherein the semiconductor isolation layer is formed after forming the buried oxide layer.

9. The method of claim 1, wherein the semiconductor isolation layer is implanted silicon.

* * * * *